(12) United States Patent
Tsai

(10) Patent No.: US 7,284,672 B2
(45) Date of Patent: Oct. 23, 2007

(54) MULTI-STAGE FASTENING STRUCTURE

(75) Inventor: Shiang-Shiang Tsai, Taoyuan Hsien (TW)

(73) Assignee: Enlight Corporation, Taoyuan Hsien (TW)

( * ) Notice: Subject to any disclaimer, the term of this patent is extended or adjusted under 35 U.S.C. 154(b) by 256 days.

(21) Appl. No.: 11/192,091

(22) Filed: Jul. 29, 2005

(65) Prior Publication Data
US 2007/0025812 A1 Feb. 1, 2007

(51) Int. Cl.
*A47B 57/00* (2006.01)
(52) U.S. Cl. .................. 211/208; 211/192; 312/265.4; 403/231; 403/241; 403/256; 403/403
(58) Field of Classification Search ............... 403/205, 403/231, 240, 241, 256, 258, 260, 262, 363, 403/403; 312/265.1, 265; 211/191, 192, 211/204, 208
See application file for complete search history.

(56) References Cited
U.S. PATENT DOCUMENTS
2,619,687 A * 12/1952 Kahn ......................... 403/262

| 6,702,124 B2 * | 3/2004 | Lauchner et al. ........... 211/192 |
| 6,948,691 B2 * | 9/2005 | Brock et al. ................. 211/192 |
| 7,093,725 B2 * | 8/2006 | Hartman et al. ............ 211/192 |

* cited by examiner

*Primary Examiner*—Daniel P. Stodola
*Assistant Examiner*—Michael P. Ferguson
(74) *Attorney, Agent, or Firm*—Troxell Law Office, PLLC

(57) ABSTRACT

A multi-stage fastening structure comprises an extension rod, a plurality of locking devices, and two fastening devices. A lateral retaining plate is formed at each end of the extension rod. A first flange and a second flange having different outer diameters from each other are formed on each of the locking devices. Each of the fastening devices comprises a sliding plate and a fastener. The sliding plate comprises: a locking part formed by bending the sliding plate; a trench formed on the sliding plate; a track mounted on each side of the trench; and a plurality of through holes formed on the sliding plate in front of the trench. The fastener comprises: a slideway on each side; an inward retaining plate on one edge of the fastener; a fingerboard on the other edge of the fastener; and a locking pawl formed on the bottom of the fastener near the fingerboard.

1 Claim, 7 Drawing Sheets

000000000000# MULTI-STAGE FASTENING STRUCTURE

FIELD OF THE INVENTION

The present invention is related to a fastening structure for use in a slideway, and more particularly to a multi-stage fastening structure with multi-stage locking devices as being applicable for different boxes without the use of screw.

BACKGROUND OF THE INVENTION

In the general server box, the cabinet, and the like, the slideway is indispensably mounted. The slideway is always coupled with the box or the lateral portion of the cabinet by a screwing method. As a result, the drawer or the tray can be coupled with the slideway for the push-pull purpose.

However, different coupling plates are provided with different specifications. In order to be suitable for boxes of different specifications, the slideways of different specifications must be provided. Accordingly, the conventional structure is short of convenience and is not suitable for use in the industry.

SUMMARY OF THE INVENTION

In view of the foregoing drawbacks of the conventional structure, the present invention discloses a multi-stage fastening structure for coupling an extension rod of a slideway with a coupling plate without the use of the screw.

It is a main object of the present invention to provide a multi-stage fastening structure with at least two-stage locking devices, wherein fastening devices are applied to couple an extension rod with a coupling plate. As a result, a slideway of the present invention can be applied to different boxes. By contrast, in the general server box, the coupling plates of different specifications are applied to the slideway. Accordingly, in the present invention, a single slideway can be applied to different coupling plates by use of the multi-stage locking devices.

Other objects and features of the present invention will become apparent from the following detailed description when taken in conjunction with the drawings in which:

DETAILED DESCRIPTION OF THE PREFERRED EMBODIMENT

The above-mentioned features and advantages of this invention, and the manner of attaining them, will become more apparent and the invention will be better understood by reference to the following description of embodiments of the invention taken in conjunction with the drawings.

Figure 1:
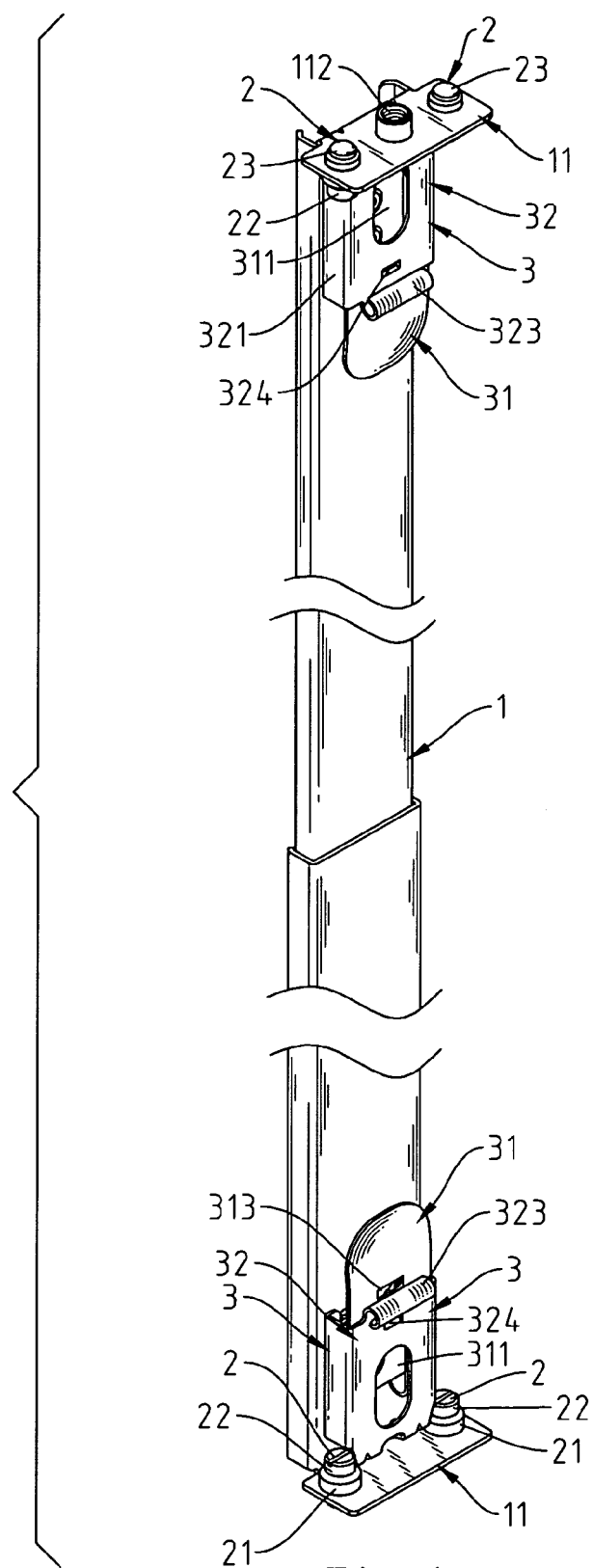
FIG. 1 is an elevational view showing the structure of the present invention.
Figure 2:
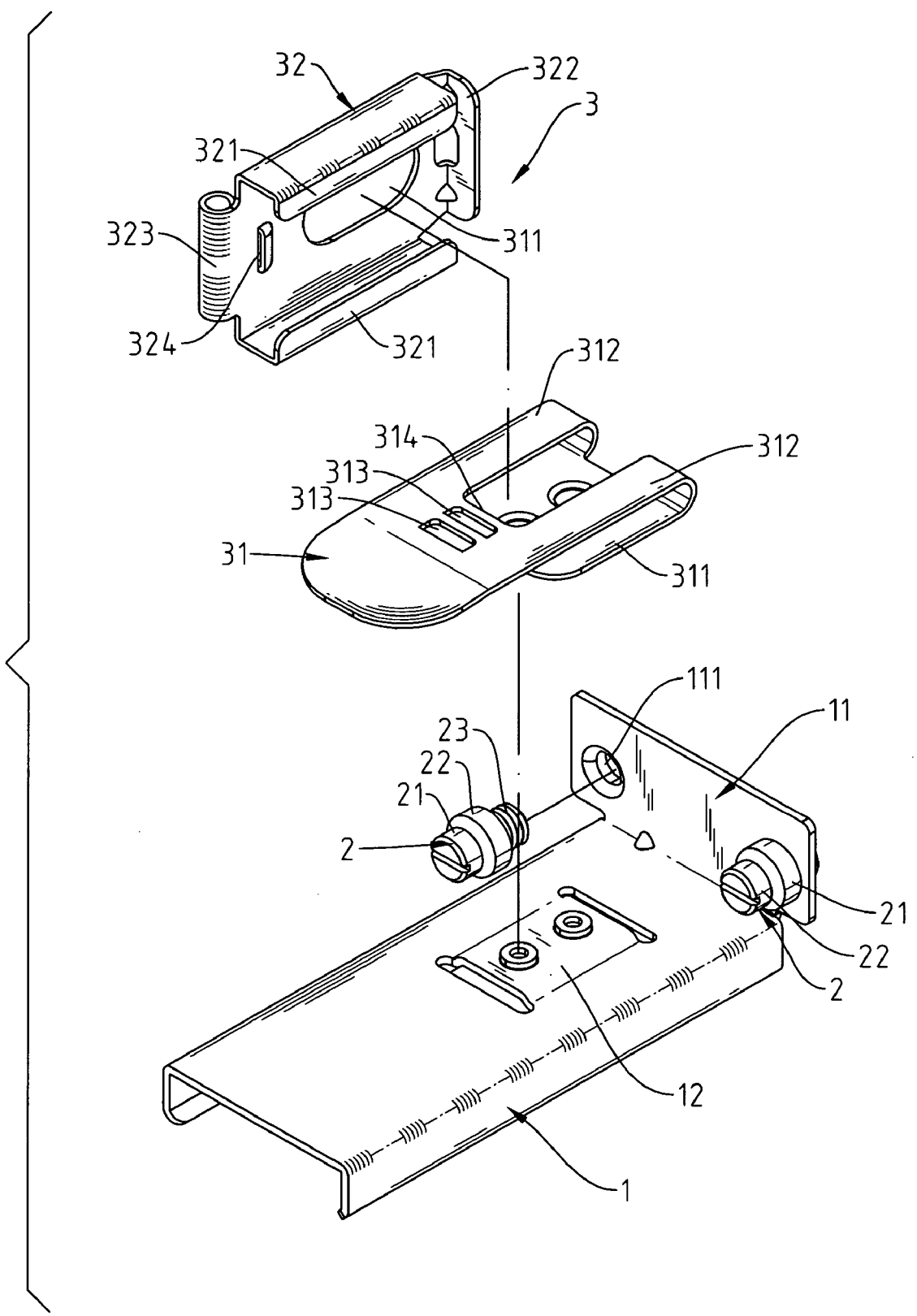
FIG. 2 is an exploded view showing the structure of the present invention.
Figure 3:
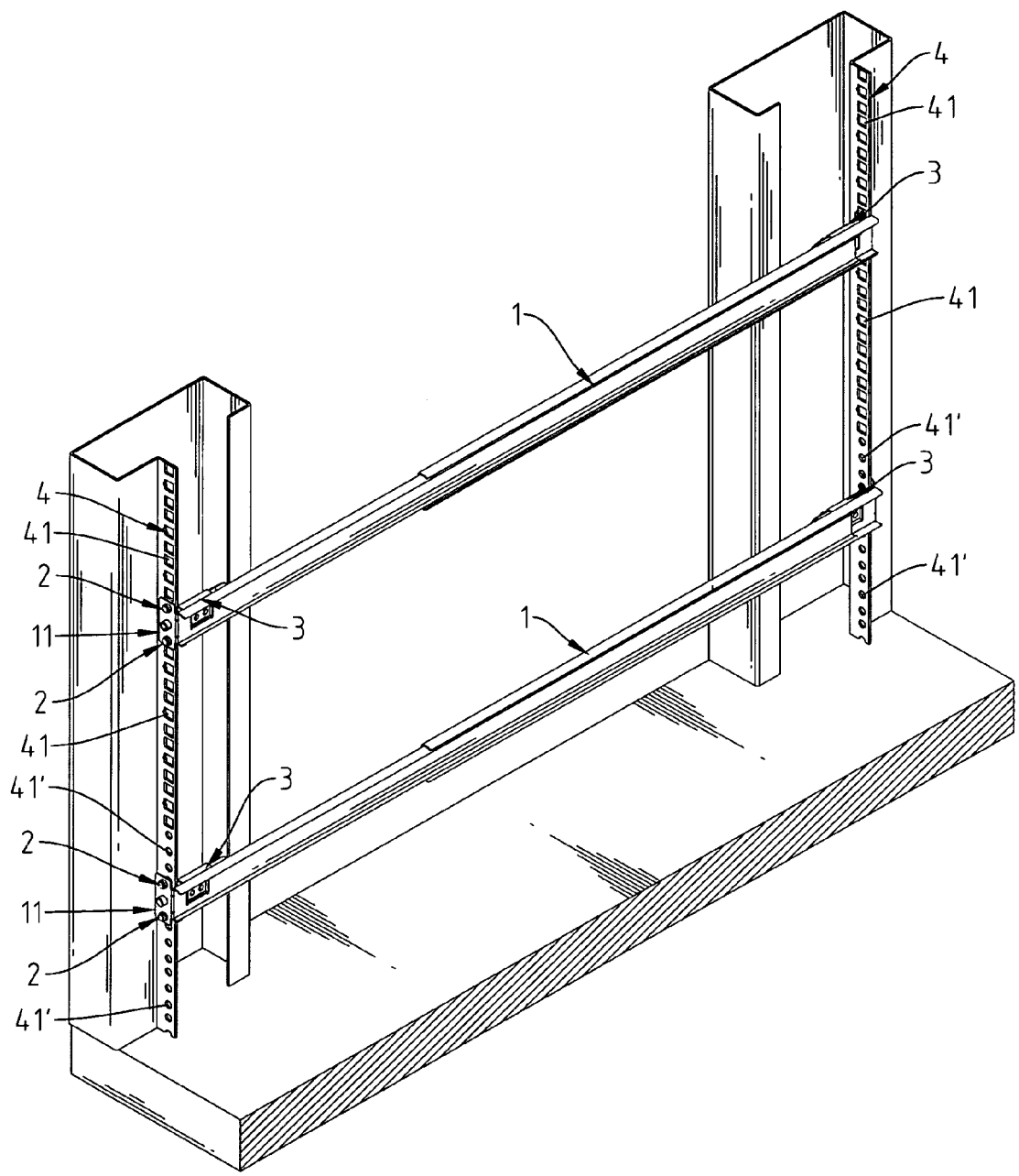
FIG. 3 is a schematic view showing that the multi-stage fastening structure is applied to a cabinet in accordance with the present invention.
Figure 4:
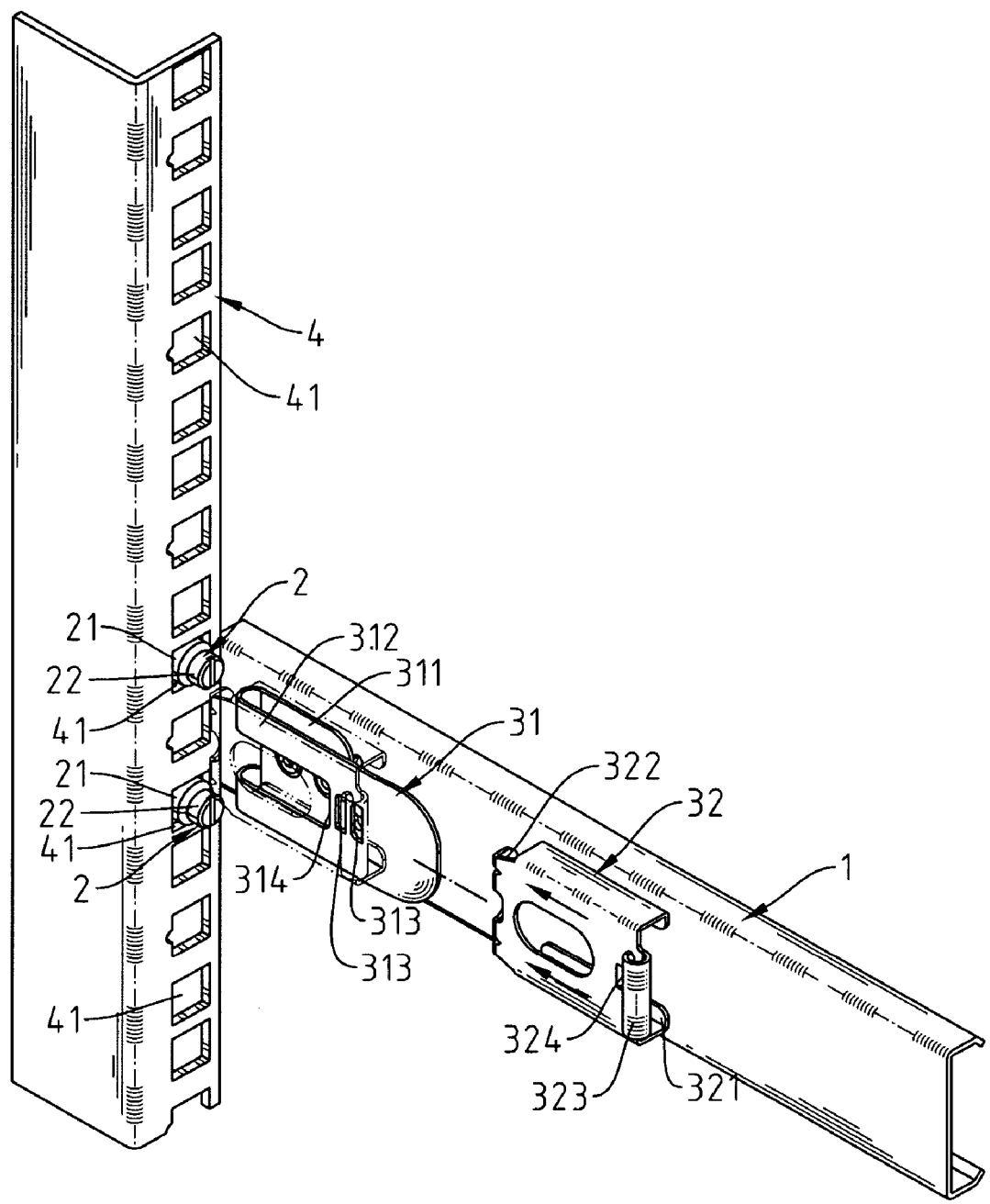
FIG. 4 is a schematic view showing that the multi-stage fastening structure is fastened in a first stage in accordance with the present invention.
Figure 5:
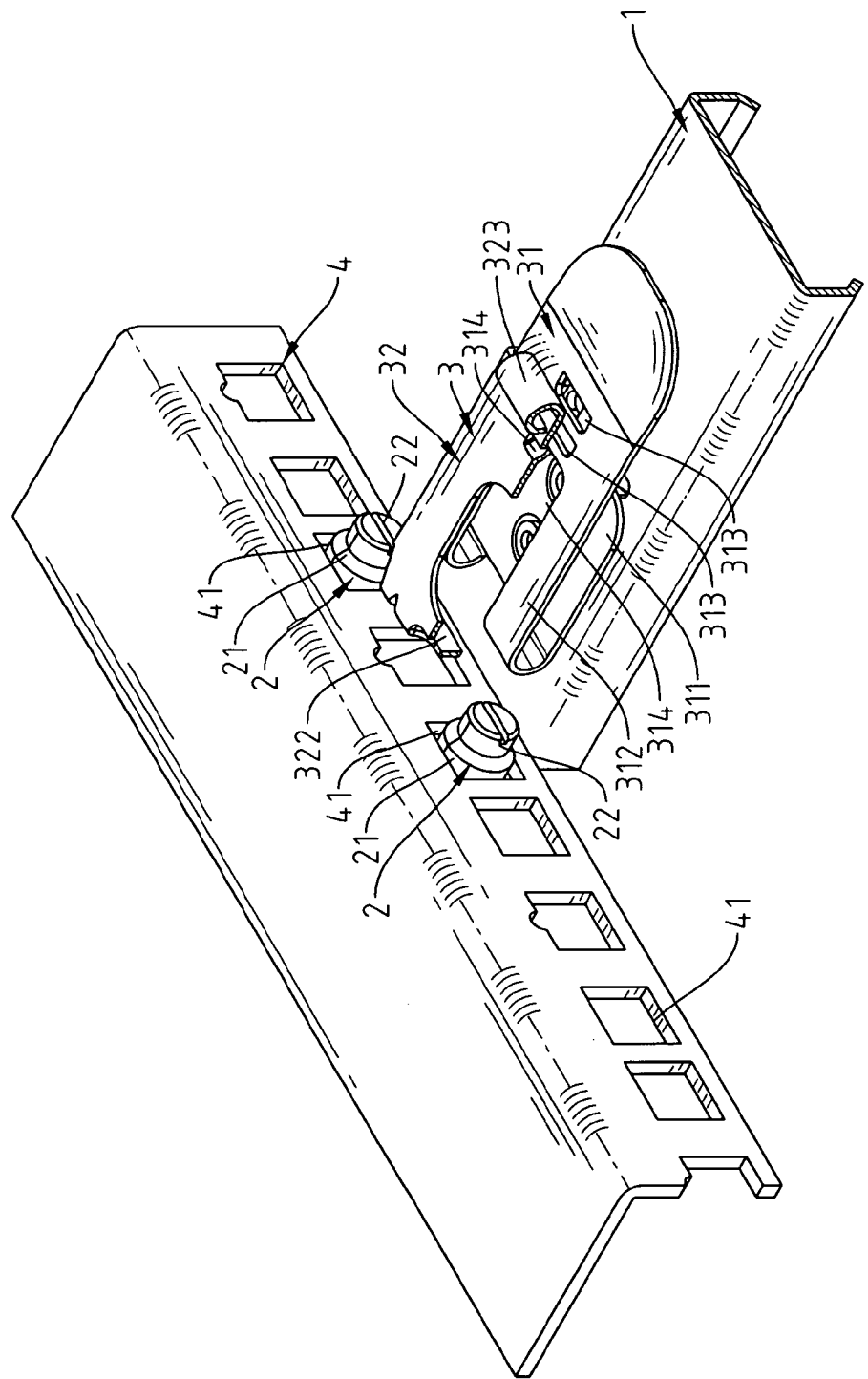
FIG. 5 is a partial, elevational, cross-sectional view of FIG. 4.

Referring to FIG. 1 through FIG. 3, a multi-stage fastening structure of the present invention is to couple an extension rod of a slideway with a coupling plate 4. The multi-stage fastening structure comprises an extension rod 1, several locking devices 2, and two fastening devices 3, wherein two screw holes 111 are formed on a lateral retaining plate 11 at each end of the extension rod 1. The screw holes 111 are formed corresponding to the connection holes 41, 41' of the coupling plate 4. A connection part 12 is mounted at each end of the extension rod 1 near the lateral retaining plate 11. Besides, a fixing part 112 is mounted on one of the lateral retaining plates 11. If the extension rod 1 is coupled with the coupling plate 4, the fixing part 112 is located to penetrate into the connection hole 41 or the connection hole 41' such that a screw can be screwed onto the fixing part 112 to strengthen the connection between the extension rod 1 and the coupling plate 4.

The locking devices 2 are inserted into the screw holes 111. A screw 23 is mounted at the rear end of each of the locking devices 2. The locking device 2 further comprises a first flange 21 and a second flange 22 corresponding to the connection holes 41 and 41', respectively. The first flange 21 and the second flange 22 have different outer diameters from each other.

Each of the fastening devices 3 comprises a sliding plate 31 and a fastener 32, wherein the sliding plate 31 is formed by bending so as to form a locking part 311 for being locked to the connection part 12. A trench 314 is formed on the sliding plate 31, and a track 312 is mounted on each side of the trench 314. Several through holes 313 are formed on the sliding plate 31 in front of the trench 314. The both sides of the fastener 32 are bent to form two slideways 321 for being coupled with the tracks 312. One edge of the fastener 32 is bent to form an inward retaining plate 322, and a fingerboard 323 is formed on the other edge of the fastener 32. A locking pawl 324 is formed on the bottom of the fastener 32 near the fingerboard 323. If there is a need to couple the fastener 32 with the sliding plate 31, the tracks 312 are slid along the slideways 321 of the fastener 32.

Referring to FIG. 2 through FIG. 5, in these diagrams, the multi-stage fastening structure of the present invention is mounted on the connection holes 41 of the coupling plate 4. The connection holes 41 and the connection holes 41' have different outer diameters from each other. As a result, the method for coupling the multi-stage fastening structure with the connection holes 41 is different from the method for coupling the multi-stage fastening structure with the connection holes 41'. When the lateral retaining plates 11 of the extension rod 1 locate across the rear area of the coupling plate 4, the locking devices 2 penetrate through the connection holes 41 and the screw holes 111. In this manner, the first flanges 21 of the locking devices 2 must be coupled with the connection holes 41 since the connection holes 41 have a larger aperture. Besides, the fasteners 32 of the fastening devices 3 are pushed toward the trenches 314 so as to enable the retaining plates 322 to lean against the coupling plate 4. The edges of the through holes 313 and the trenches 314 formed on the fastener 32 also enable the fastener 32 to be positioned during push. When the fastener 32 contacts the coupling plate 4, the locking pawl 324 of the fastener 32 fastens to and positions on the edge of the trench 314. The positioning position of the locking pawl 324 of the fastener 32 can be adjusted in accordance with practical situation even if the coupling plate 4 has a thicker thickness.

Figure 6:
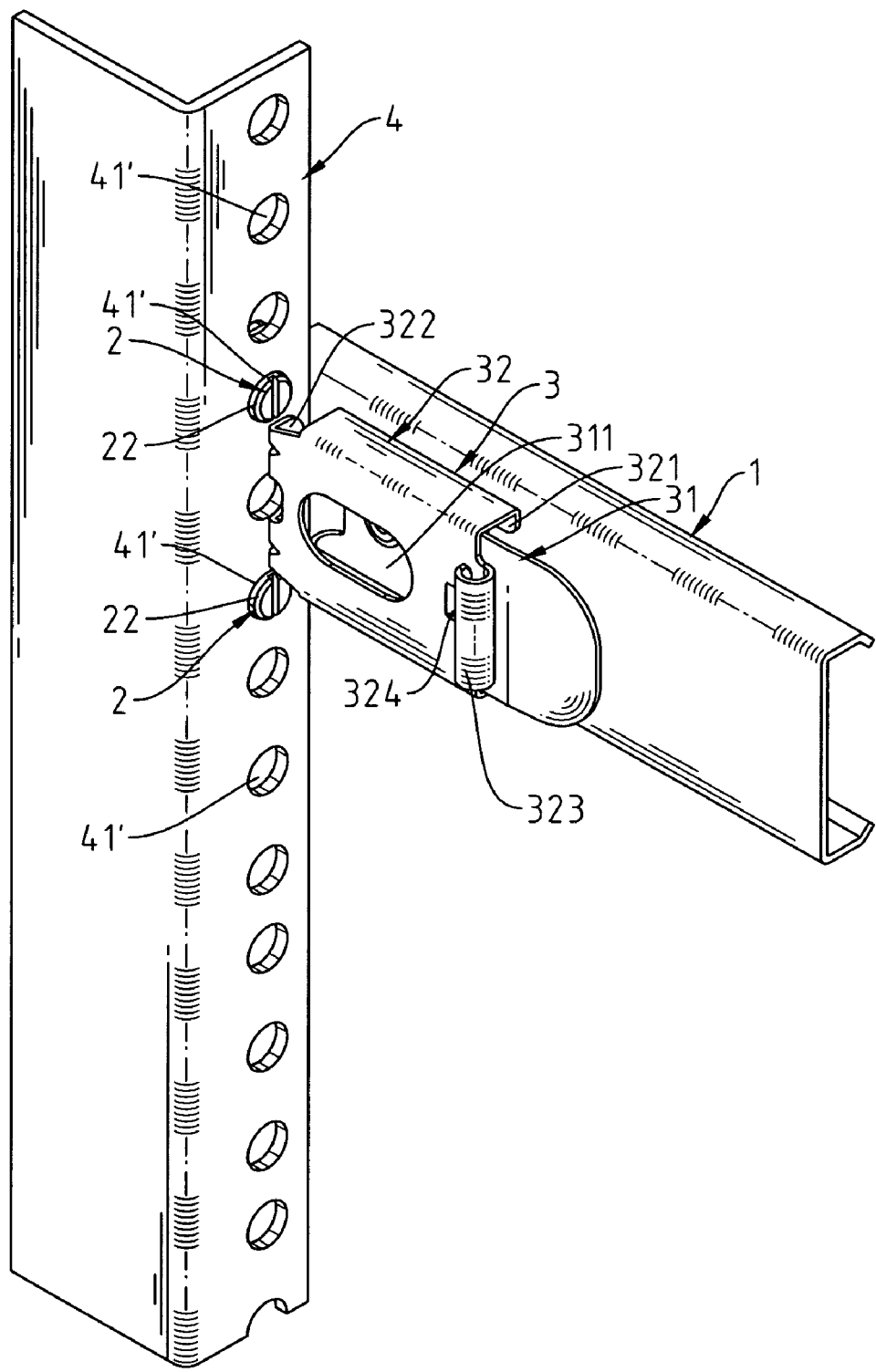
FIG. 6 is a schematic view showing that the multi-stage fastening structure is fastened in a second stage in accordance with the present invention.
Figure 7:
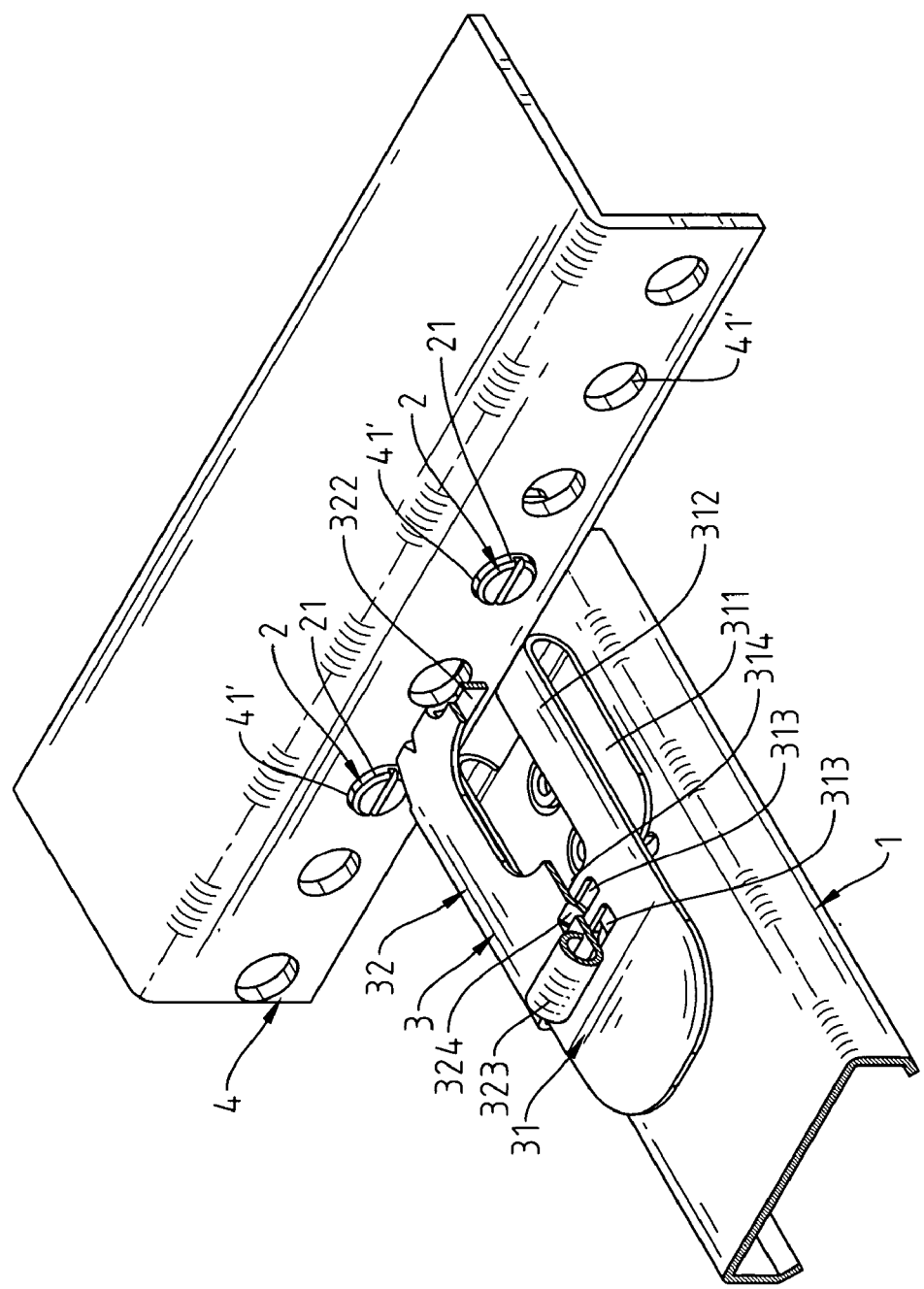
FIG. 7 is a partial, elevational, cross-sectional view of FIG. 6.

Referring to FIG. 6 and FIG. 7, when the connection holes 41' of the coupling plate 4 have a smaller aperture, the second flanges 22 of the locking devices 2 can be applied to enable the locking devices 2 to be coupled with the connection holes 41'. When the second flanges 22 couple with the connection holes 41', their coupling positions are different from the coupling positions described in the aforementioned embodiment. As a result, the positioning position of the fastening devices 3 must be adjusted, wherein the fasteners 32 of the fastening devices 3 are pushed toward the trenches 314 to enable the retaining plates 322 to lean against the coupling plate 4. Besides, the edges of the through holes 313 and the trench 314 formed on the fastener 32 also enable the fastener 32 to be positioned during push. When the fastener 32 contacts the coupling plate 4, the locking pawl 324 of the fastener 32 fastens to and positions on the through hole 313 adjacent to the trench 314. The positioning position of the locking pawl 324 of the fastener 32 can be adjusted in accordance with practical situation even if the coupling plate 4 has a thicker thickness.

The extension rod 1 can be coupled with the connection holes 41, 41' of the coupling plate 4 on different locations by adjusting the fastening devices 3. Besides, the adoption of the fastening devices 3 also provides the convenience in coupling the extension rod 1 with the coupling plate 4. The utilization of the multi-stage fastening structure of the present invention is convenient and timesaving since there is no need to use any tool.

The invention claimed is:

1. A multi-stage fastening structure, comprising:

an extension rod having two screw holes formed on a lateral retaining plate at each end of the extension rod and a connection part mounted at each end of the extension rod near the lateral retaining plate;

a plurality of locking devices, each having a first flange and a second flange having different outer diameters from each other; and two fastening devices, each comprising a sliding plate and a fastener, wherein the sliding plate comprises: a locking part formed by bending the sliding plate and being locked to the connection part; a trench formed on the sliding plate; a track mounted on each side of the trench; and a plurality of through holes formed on the sliding plate in front of the trench, and the fastener comprises: a slideway formed on each side for being coupled with the track; an inward retaining plate formed on one edge of the fastener; a fingerboard formed on the other edge of the fastener; and a locking pawl formed on the bottom of the fastener near the fingerboard, whereby when coupling the fastener with the sliding plate, the slideways of the fastener are slid along the tracks such that the locking devices can be coupled with connection holes with different apertures on a coupling plate by use of the first flanges or the second flanges, and that a locking position of the fastener on the sliding plate can be adjusted so as to couple the extension rod with the coupling plate.

* * * * *